United States Patent [19]

Tepman

[11] Patent Number: 5,223,112
[45] Date of Patent: Jun. 29, 1993

[54] REMOVABLE SHUTTER APPARATUS FOR A SEMICONDUCTOR PROCESS CHAMBER

[75] Inventor: Avi Tepman, Cupertino, Calif.

[73] Assignee: Applied Materials, Inc., Santa Clara, Calif.

[21] Appl. No.: 693,844

[22] Filed: Apr. 30, 1991

[51] Int. Cl.$^5$ .............................................. C23C 14/34
[52] U.S. Cl. ........................... 204/298.11; 204/298.25; 204/298.15
[58] Field of Search ................. 204/298.11, 298.15, 204/298.25, 298.26; 118/719, 723

[56] References Cited

U.S. PATENT DOCUMENTS

| | | | |
|---|---|---|---|
| 4,548,699 | 10/1985 | Hutchinson et al. | 204/298.25 |
| 4,718,975 | 1/1988 | Bowling et al. | 204/298.11 X |
| 4,756,815 | 7/1988 | Turner et al. | 204/298.25 |
| 4,851,101 | 7/1989 | Hutchinson | 204/298.25 X |

FOREIGN PATENT DOCUMENTS 0238267  10/1988  Japan ............................ 204/298.11

Primary Examiner—Nam X. Nguyen
Attorney, Agent, or Firm—Claude A. S. Hamrick

[57] ABSTRACT

Removable shutter apparatus for a deposition or etching apparatus including a shuttering mechanism disposed within a processing chamber and adapted to carry a shutter plate between a retracted position and an extended position wherein it is engaged by a lifting assembly and moved into position closing the normal plating aperture as if it were a substrate to be processed. When a new product substrate is presented for processing, the lifting assembly will lower the shutter plate back onto the shuttering mechanism and it will be moved to its retracted position out of the way of the normal handling and processing operation. Because the shutter plate is geometrically similar to the product substrate and is handled by the same lift assembly, the same robotic shuttling mechanism used to transport product substrates into and out of the chamber may be used to periodically remove and replace a used shutter plate with a new plate without shutting down the system. An important advantage of the present invention is that the shutter closes, and thus "shadows", exactly the same processing aperture closed by the substrate during its processing.

10 Claims, 3 Drawing Sheets

REMOVABLE SHUTTER APPARATUS FOR A SEMICONDUCTOR PROCESS CHAMBER

BACKGROUND OF THE INVENTION

1. Field of the Invention

The present invention relates generally to substrate surface processing apparatus and more particularly to a removable shutter mechanism for use in closing the substrate exposure aperture of a semiconductor processing or other deposition or etching process chamber.

2. Brief Description of the Prior Art

It is a common practice in the semiconductor processing industry to plate the surface of a semiconductor wafer with a metal or metal oxide using a sputtering technique wherein a wafer is disposed in an evacuated chamber and a metallic material is electrically removed from an anode and plated onto the wafer surface.

Wafers are normally shuttled in and out of the processing chamber by a robotic mechanism. The conventional practice is to either interrupt the plating process each time a wafer is inserted or removed from the processing chamber, or in the case where the sputtering operation is continuous, to provide a shuttering mechanism of some type for covering the opening normally occupied by the wafer.

In the first case, the primary disadvantage relates to the reduced throughput of the system, as time must be allowed for ramping up and ramping down the plating operation.

Apparatus for implementing the second case is illustrated in FIG. 1 of the drawing and includes an evacuable chamber formed by a housing 10 and closure 12, the lower surface of the closure being formed by a metallic plate 14 which serves as the system anode. Also depicted is a source of material to be sputtered onto a wafer 16 shown supported above a heating plate 17 by a lift assembly 18 including four upstanding fingers 19. The system cathode is formed by a bowl 20 having a central aperture 22 formed therein. Resting within the bottom of bowl 20 is an annular clamping mechanism 24 having a lip 26 formed about an inner annulus thereof and adapted to be engaged by the perimeter of wafer 16 as it is raised by lift assembly 18 into the plating position shown by the dashed lines 16'. The heating plate 17 is movable between the lower position shown by the solid lines and an upper position immediately beneath wafer 16' as depicted by the dashed lines 19'.

In order to close the plating aperture 22 during the removal and replacement of wafer 16, a shutter 32, normally positioned to the side, is moved into the position shown by the dashed lines 32' so as to block the path of the plating ions. Since plating material will build up on the surfaces of both shutter 32, cathode 20 and clamping ring 24, shutter 32 must be positioned above these elements a sufficient distance to prevent contact therewith. Accordingly, in order to be effective the shutter 32 must be much larger than a wafer. This means that the inner peripheral surface portion of the clamping mechanism covered by the shutter can not be reconditioned during the time that the shutter is in position. Accordingly, the chamber must be periodically opened to allow access to the clamp.

Furthermore, where a reactive gas is introduced into the chamber to react with the metal ions and form metal oxides, the oxides that plate onto the shutter will be somewhat brittle and unless removed will crack and flake off causing contamination of the chamber. Accordingly, a particular shutter can only be used for a limited time after which the chamber must be opened to allow its replacement. This of course limits the efficiency of the apparatus and affects the reliability of the system.

Similar apparatus is used to implement etching and other deposition processes and is subject to the same or similar disadvantages pointed out above.

SUMMARY OF THE PRESENT INVENTION

Briefly, a preferred embodiment of the present invention includes a shuttering mechanism disposed within a processing chamber and adapted to carry a shutter plate in the shape of a wafer or other substrate to be processed between a retracted position and an extended position wherein it may be engaged by a lifting assembly and moved into position closing the normal processing aperture, as if it were a wafer to be plated or otherwise processed. When a new substrate is ready to be presented for processing, the lifting assembly will lower the shutter plate back onto the shutter transport mechanism and it will be moved to its retracted position out of the way of the normal substrate handling and processing operation. Because the shutter plate is geometrically similar to the substrate to be processed and is handled by the same lift assembly, the same robotic shuttling mechanism used to move substrates into and out of the chamber may be used to periodically remove and replace a used shutter plate with a new plate without shutting down the system. An important advantage of the present invention is that the shutter closes, and thus "shadows", exactly the same processing aperture closed by the substrate during its processing.

BRIEF DESCRIPTION DRAWING

DETAILED DESCRIPTION OF THE PREFERRED EMBODIMENTS

Figure 1:
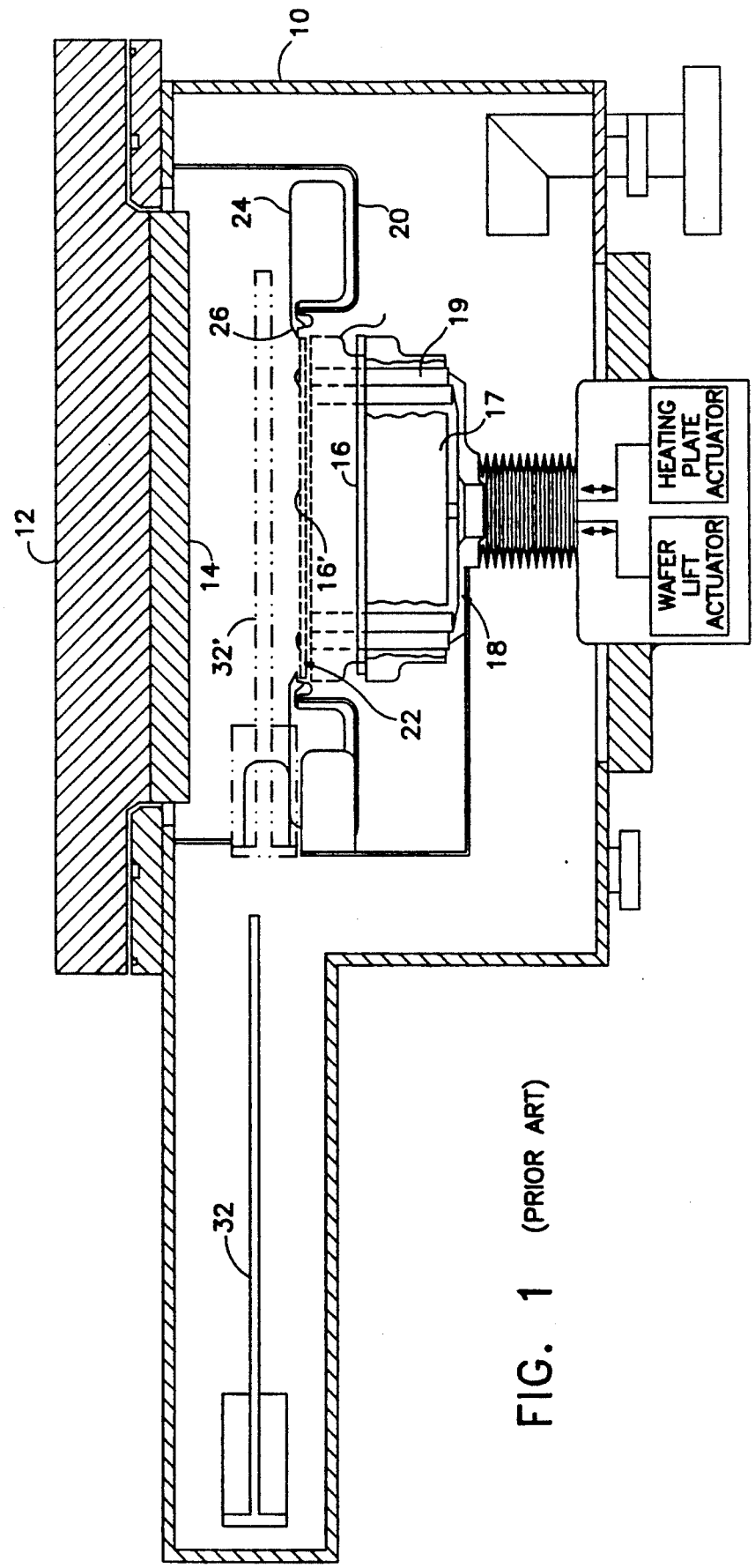
FIG. 1 is a cross-sectional view schematically illustrating a prior art processing chamber and shutter mechanism.
Figure 2:
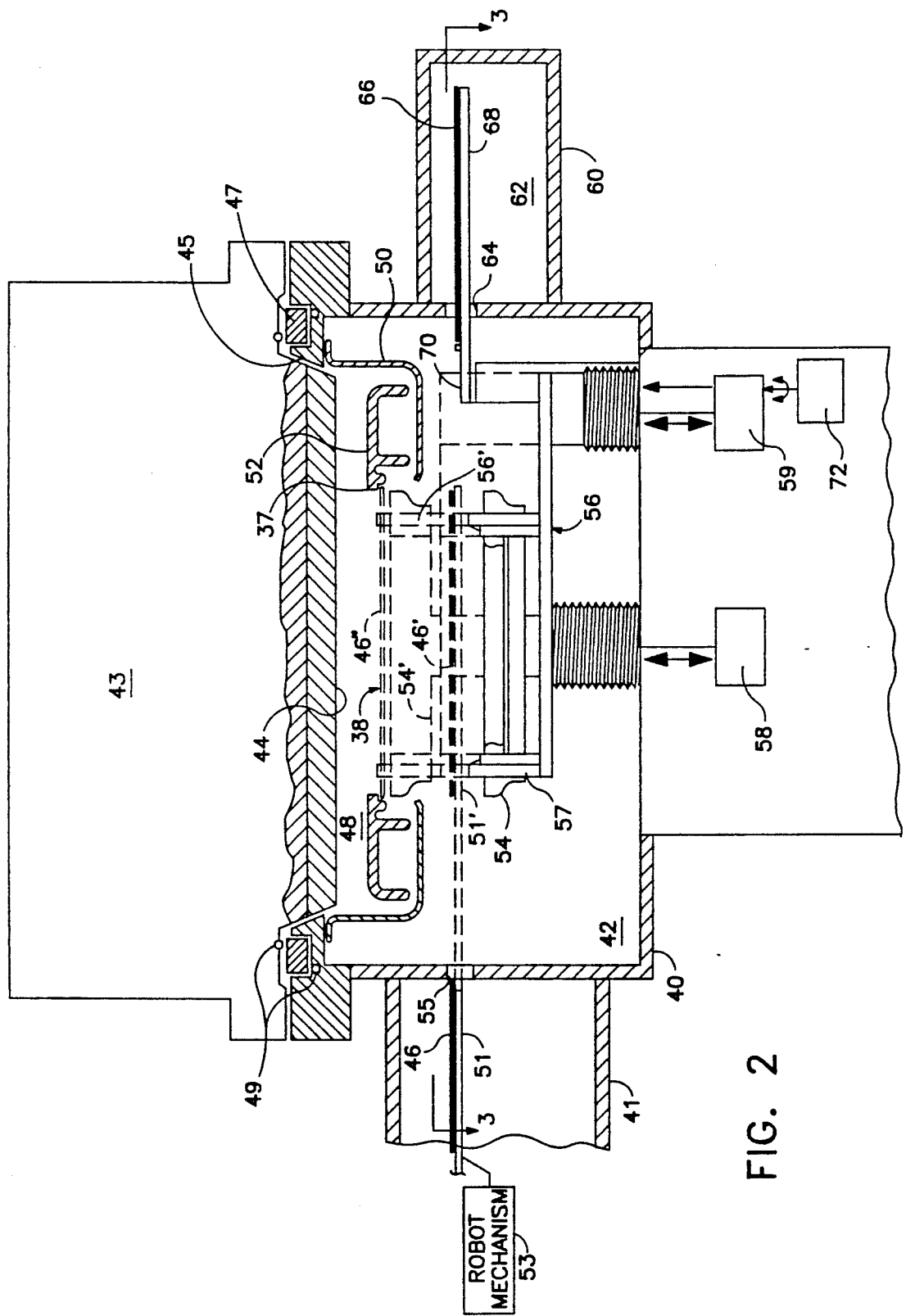
FIGS. 2 and 3 are respectively side and top cross-sectional views showing a processing chamber and shutter mechanism in accordance with the present invention.

Referring now to FIG. 2 of the drawing, a preferred embodiment of the present invention is shown implemented in apparatus adapted to sputter a metal coating onto a semiconductive wafer. In such embodiment, a housing 40 is depicted forming an evacuable processing chamber 42, the upper portion of which forms a sputtering region wherein metal is sputtered from an anode plate 44 onto the upper surface of a wafer 46". Chamber 42 is openable at the top and closed by the anode assembly 43 which includes the anode plate 44 which extends into the circular opening 45 formed in the top of housing 40. Note that the closure 43 is electrically isolated from housing 40 by means of an insulative ring 47 and is pneumatically sealed thereto by means of resilient O-rings 49. The sputtering region 48 is defined by the anode plate 44, a cathode forming bowl 50 having a central opening 36 formed in the bottom thereof, and a wafer clamp 52 the inner periphery 37 of which defines a plating aperture or opening 38. The anode and cathode are electrically interconnected in a manner well known in the art.

Disposed within chamber 42 is a wafer heating plate 54 and a lift assembly 56 including four upstanding wafer-engaging fingers 57. Heating plate 54 is moved by an actuator 58 between a lower position, as shown by the solid lines, and an upper position, indicated by the dashed lines 54' located immediately below the in-place wafer 46".

As will be further explained below, lifting assembly 56 is moved by an actuator 59 between a lower position, as shown by the solid lines, and an upper position indicated by the dashed lines 56'.

Extending from one side of housing 40 is means 41 a communicating passageway for the shuttle blade 51 of a robotic wafer transport mechanism 53 which moves wafers into and out of chamber 42 through a slit 55 as suggested by the dashed lines 51'.

Extending from the right side of housing 40, as depicted, is an extended housing 60 forming a subchamber 62 which communicates with chamber 42 by means of a slit 64 and forms a retraction compartment for a shutter plate 66 and its associated transport arm 68. Arm 68 is connected to the rotatable shaft 70 of a rotary actuator 72 and, as is more clearly shown in FIG. 3, swings from the retracted position 68 indicated to an extended position 68' lying above heating plate 54.

Figure 3:
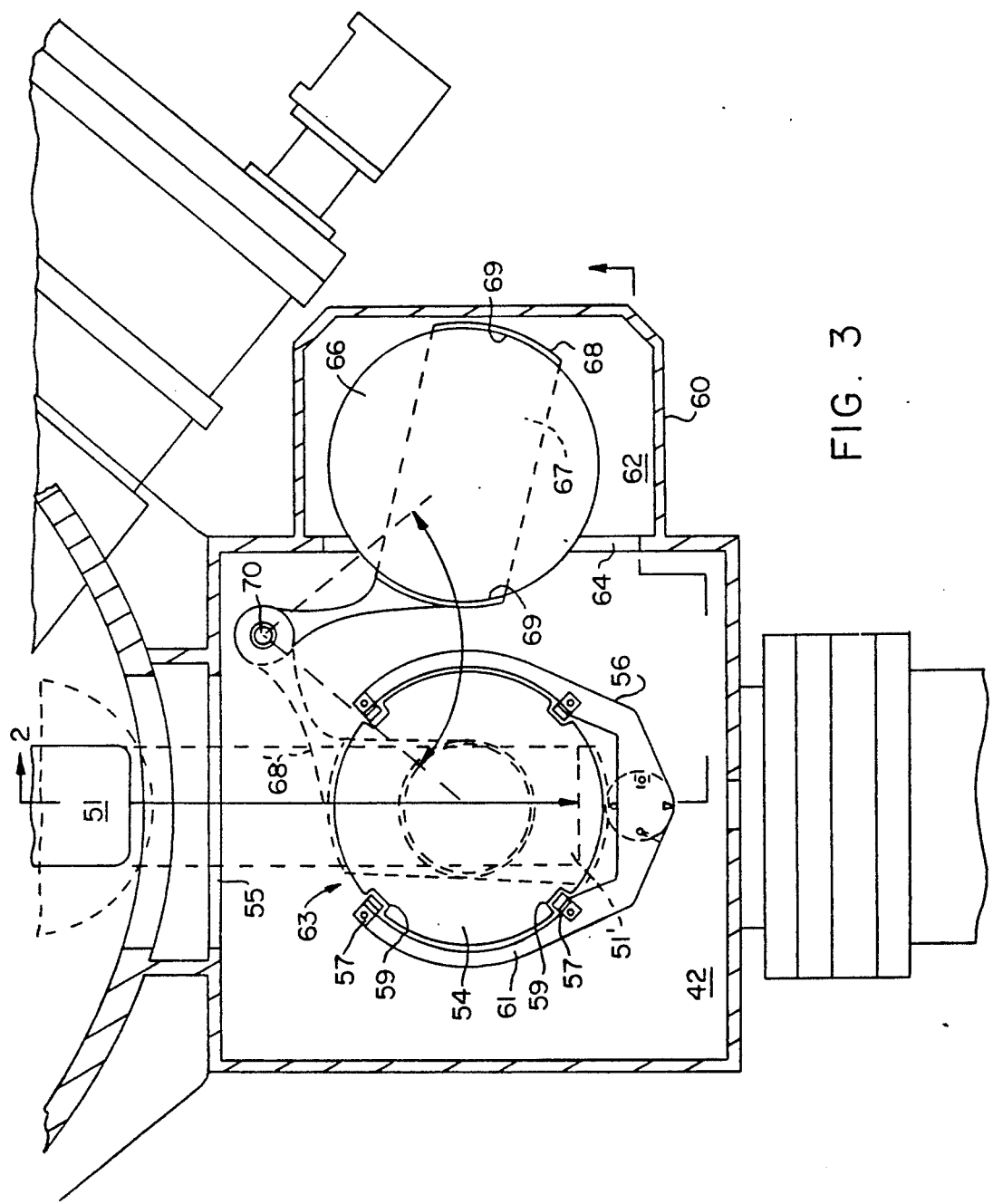

Turning now to FIG. 3, which is a top cross-sectional view taken generally along the line 3—3 of FIG. 2, it is to be understood that for convenience and clarity of disclosure certain artistic license was taken in FIG. 2 to unfold and two-dimensionally illustrate a cross-section taken along the line 2—2 of FIG. 3. As depicted, shutter plate 66 rests upon a transport arm base portion 67 and is held in place by upstanding ribs or lips 69, and can be swung from its retracted position 68 within chamber 62 to its extended position 68' overlying heating plate 54. Shutter plate 66 is normally a disk configured substantially similar to a wafer to be processed and is made of a metal, ceramic or other suitable material.

In operation, referring simultaneously to FIGS. 2 and 3, it will be understood that a wafer 46 resting atop the transport blade 51 of robot mechanism 53 can be moved through slit 55 and into the position 46' where it can be lifted from blade 51 into the plating position 46" (in opening 38) by the lifting fingers 57. Note in FIG. 3 that the lift assembly 56 includes a yoke-like structure including arms 61 that are open at 63 to provide clearance for blade 51 when it is in the position 51'. As soon as blade 51 is withdrawn, heating plate 54 can be raised into its wafer heating position immediately below the bottom surface of wafer 46". Note that notches 59 are provided in heating plate 54 to provide clearance for lift fingers 57. The wafer, lift assembly and heating plate 50 will remain in the raised position for a predetermined period of time to accomplish the plating operation after Which heating plate 54 will be lowered, robot shuttle blade 51 will be reinserted into the position 51', and lift assembly 56 will be caused to lower wafer 46" onto blade 51' as indicated at 46' (FIG. 2). Assembly 56 will then continue to be lowered until wafer 46' is clear of fingers 57 and can be withdrawn by blade 51.

As soon as blade 51 has caused wafer 46' to clear the top of heating plate 54, actuator 72 can be energized to swing arm 68 and shutter plate 66 into position over heating plate 54 and in alignment with fingers 57. Actuator 59 will then be energized to lift assembly 56 into engagement with shutter plate 66, and will continue to move upwardly raising plate 66 off of arm 68 and into the plating position previously occupied by wafer 46". This effectively closes the plating aperture or opening 38 and allows the system to continue to run. When a new wafer is ready to be plated, the operative cycle will be reversed, the shutter plate retracted into chamber 62, and the new wafer moved into position for plating.

Since the time required to remove wafer 46" and replace it with shutter plate 66', and vice versa, is very short, little plating material will, in the interim, pass through the open aperture 38. This means that the temperature and pressure of the chamber can be held substantially constant with the result that the plating quality from wafer to wafer will be more uniform.

Another advantage of the present invention is that since lift assembly 56 lifts both wafer and shutter plate in the same manner and both are of substantial size and shape, the exchange cycle can be periodically altered to remove and replace a shutter plate "on the fly". This is to say that when a shutter plate change is desired, instead of lowering the shutter plate onto the transport arm 68, the arm can be swung to the side empty and shuttle blade 51 can be inserted into position over heating plate 54. The shutter plate can then be lowered onto blade 51 and transported thereby to a discharge bin or cleaning chamber. A new shutter plate can then be returned on blade 51 to the chamber 42 where it can be lifted from blade 51 by assembly 56 and then lowered onto transport arm 68 to assume its operational role. This of course means that heretofore unattainably high levels of system reliability and efficiency and low levels of contamination can be achieved and maintained.

Although a swing arm configuration has been disclosed above as the preferred means of moving a shutter plate into and out of the lift system, it will be appreciated that in the alternative a reciprocatable blade type, or any other suitable type of shutter transport means could be utilized to present the shutter plate to the lift assembly or to itself lift the shutter plate into the plating aperture. Furthermore, it will be appreciated that the novel combination of functional elements disclosed above is not limited to sputtering applications and in fact will have application in similar apparatus used to implement many other substrate deposition and/or etching processes.

Accordingly, since numerous alternate applications, alterations and modifications thereof will no doubt become apparent to those skilled in the art after having read this disclosure, it is intended that the appended claims be interpreted broadly to cover all such applications, alterations and modifications as fall within the true spirit and scope of the invention.

What is claimed is:

1. In a processing system including a processing chamber or subchamber having an opening into which a substrate having a surface to be coated or otherwise treated may be disposed, lift means for moving the substrate into and then out of said opening, and shutter means for temporarily blocking said opening during the time that a processed substrate is being removed and replaced by an unprocessed substrate, an improved shutter means, comprising:

a shutter plate having certain physical characteristics substantially similar to those of a substrate to be processed; and shutter plate transport means operative to transport said shutter plate between a first position alighted with said lift means where said shutter plate can be engaged by said lift means, lifted from said transport means and moved into said opening in place of a substrate, and a second position retracted from said first position.

2. In a processing system as recited in claim 1 wherein said substrate is a substantially circular semiconductive wafer and said shutter plate is a substantially circular plate having a circumferential size and configuration substantially identical to that of said wafer.

3. In a processing system as recited in claim 2 wherein said transport means includes a pivotally mounted platform for holding said shutter plate, and drive means for causing said platform to rotate about a pivot axis in transporting said shutter plate between said first position and said second position.

4. In a processing system as recited in claims 1, 2 or 3 wherein said system further includes means for carrying said substrate into alignment with said means for moving whereby a substrate to be processed can be loaded onto said means for moving and a processed substrate can be off-loaded onto said means for carrying for removal from said chamber.

5. In a processing system as recited in claim 4 wherein said shutter plate transport means is also operative to position said shutter plate in alignment with said means for carrying so that said means for carrying may additionally be used to remove a used shutter plate from the chamber and to replace it with a different shutter plate.

6. In a processing system as recited in claim 1 wherein said transport means includes a pivotally mounted platform for holding said shutter plate, and drive means for causing said platform to rotate about a pivot axis in moving said shutter plate between said first position and said second position.

7. A semiconductor wafer processing system comprising:
 means forming a processing chamber having an opening for receiving a semiconductor wafer to be processed;
 lift means for moving a wafer to be processed along a path between a first position and a second position within said opening; and
 shutter means including a shutter plate and a transport means for transporting said shutter plate between a position in alignment with said path and a position retracted therefrom, whereby when said wafer is not disposed within said opening, said shutter plate may be engaged by said lift means, removed from said transport means and moved into the position within sad opening normally occupied by said wafer.

8. A semiconductor wafer processing system as recited in claim 7 wherein said transport means includes a pivotally mounted platform for holding said shutter plate, and drive means for causing said platform to rotate about a pivot axis in moving said shutter plate between said position in alignment and its retracted position.

9. A semiconductor wafer processing system as recited in claim 7 or 8 and further comprising means for carrying a wafer into alignment with said lift means whereby a wafer to be processed can be off-loaded from said means for carrying and loaded onto said lift means for movement into said opening, and a processed wafer can be off-loaded from said lift means and loaded onto said means for carrying for removal from said chamber.

10. A semiconductor wafer processing system as recited in claim 9 wherein said transport means is additionally operative to position said shutter plate in alignment with said means for carrying so that said means for carrying may be alternatively used to remove a used shutter plate from the chamber and to replace it with a different shutter plate.

* * * * *